US012775207B2

(12) United States Patent
Shin et al.

(10) Patent No.: US 12,775,207 B2
(45) Date of Patent: Oct. 27, 2026

(54) OPTICAL PROXIMITY CORRECTION METHOD USING NEURAL JACOBIAN MATRIX AND METHOD OF MANUFACTURING MASK BY USING THE OPTICAL PROXIMITY CORRECTION METHOD

(71) Applicant: Samsung Electronics Co., Ltd., Suwon-si (KR)

(72) Inventors: Moojoon Shin, Suwon-si (KR); Sooyong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 825 days.

(21) Appl. No.: 18/131,436

(22) Filed: Apr. 6, 2023

(65) Prior Publication Data

US 2024/0045321 A1 Feb. 8, 2024

(30) Foreign Application Priority Data

Aug. 8, 2022 (KR) ........................ 10-2022-0098838

(51) Int. Cl.
*G03F 1/36* (2012.01)
*G03F 1/44* (2012.01)
*G03F 7/00* (2006.01)

(52) U.S. Cl.
CPC .................. *G03F 1/36* (2013.01); *G03F 1/44* (2013.01); *G03F 7/70425* (2013.01); *G03F 7/705* (2013.01)

(58) Field of Classification Search
USPC ............................................................ 716/53
See application file for complete search history.

(56) References Cited

U.S. PATENT DOCUMENTS 6,928,634 B2 8/2005 Granik et al.
7,707,538 B2 4/2010 Wong et al.
8,239,786 B2 * 8/2012 Wong ........................ G03F 1/36 716/54
10,146,124 B2 * 12/2018 Li ............................ G03F 1/36
10,430,543 B2 * 10/2019 Cecil ........................ G06F 30/20
11,397,840 B1 * 7/2022 Jang .......................... G03F 1/70
2007/0094634 A1 * 4/2007 Seizginer .................. G03F 1/36 716/54
2009/0299929 A1 12/2009 Kozma et al.
(Continued)

FOREIGN PATENT DOCUMENTS

CN 117272919 A * 12/2023 ........... G06F 30/398
KR 20180116388 A * 10/2018 ......... G03F 7/70683
KR 20210127984 A 10/2021

*Primary Examiner* — Mohammed Alam
(74) *Attorney, Agent, or Firm* — Wolf, Greenfield & Sacks, P.C.

(57) ABSTRACT

An optical proximity correction (OPC) method using a Jacobian matrix, which may minimize an edge placement error (EPE) of an arbitrary pattern, and a method of manufacturing a mask by using the OPC method. The OPC method may include obtaining training data for calculating a differentiation Jacobian matrix of a mask segment of an EPE, obtaining a neural Jacobian matrix model through artificial neural network (ANN) training using the training data, and applying a prediction value based on the neural Jacobian matrix model to mask optimization (MO) to minimize the EPE.

19 Claims, 17 Drawing Sheets

(56) References Cited

U.S. PATENT DOCUMENTS

| | | | | |
|---|---|---|---|---|
| 2010/0167184 | A1* | 7/2010 | Wong | G03F 1/36<br>716/54 |
| 2019/0146455 | A1* | 5/2019 | Beylkin | G06F 30/392<br>700/97 |
| 2020/0356011 | A1* | 11/2020 | Su | G03F 7/70441 |
| 2022/0155695 | A1* | 5/2022 | Moon | G06N 3/08 |

* cited by examiner

FIG. 4B $e_j$ $m_i$

| | E1 | E2 | E3 | E4 |
|---|---|---|---|---|
| M1 | 0.45 | 0.14 | 0.08 | −0.03 |
| M2 | 0.70 | 0.3 | 0.13 | 0.02 |
| M3 | 0.43 | 0.12 | 0.17 | −0.04 |
| M4 | 0.78 | 0.52 | 0.73 | 0.1 |
| M5 | 0.18 | 0.14 | 0.4 | 0.19 |
| M6 | 0.07 | 0.11 | 0.33 | 0.1 |
| M7 | 0.1 | 0.27 | 0.7 | 0 |

$\frac{de_j}{dm_2}$

OPTICAL PROXIMITY CORRECTION METHOD USING NEURAL JACOBIAN MATRIX AND METHOD OF MANUFACTURING MASK BY USING THE OPTICAL PROXIMITY CORRECTION METHOD

CROSS-REFERENCE TO RELATED APPLICATION

This application is based on and claims priority under 35 U.S.C. § 119 to Korean Patent Application No. 10-2022-0098838, filed on Aug. 8, 2022, in the Korean Intellectual Property Office, the disclosure of which is incorporated by reference herein in its entirety.

BACKGROUND

The present disclosure relates to a method of manufacturing a mask, and more particularly, to an optical proximity correction (OPC) method and a method of manufacturing a mask by using the OPC method.

In a semiconductor process, photolithography using a mask may be performed for forming a pattern on a semiconductor substrate, such as a wafer. A mask may be referred to as a pattern transfer body where a pattern of an opaque material is formed on a transparent substrate. In order to manufacture a mask, a layout of a desired pattern may be designed first, and then, OPCed layout data obtained through OPC may be transferred as mask tape-out (MTO) design data. Subsequently, mask data preparation (MDP) may be performed based on the MTO design data, and an exposure process may be performed on a mask substrate.

SUMMARY

The present disclosure provides an optical proximity correction (OPC) method using a Jacobian matrix, which may minimize an edge placement error (EPE) of an arbitrary pattern, and a method of manufacturing a mask by using the OPC method.

The object of the inventive concepts is not limited to the aforesaid, but other objects not described herein will be clearly understood by those of ordinary skill in the art from descriptions below.

According to some aspects of the inventive concepts, there is provided an optical proximity correction (OPC) method for a mask used in manufacturing a pattern in a semiconductor process, the method including obtaining training data for calculating a Jacobian matrix of a mask segment of an edge placement error (EPE), obtaining a neural Jacobian matrix model through artificial neural network (ANN) training using the training data, and applying a prediction value based on the neural Jacobian matrix model to mask optimization (MO) to minimize the EPE, resulting in a mask layout used to generate the mask.

According to some aspects of the inventive concepts, there is provided an optical proximity correction (OPC) method for a mask layout used in manufacturing a semiconductor pattern, the OPC method including obtaining first training data and second training data, the first training data corresponding to a relative feature between an arbitrary mask segment and peripheral simulation points and the second training data corresponding to a response to the peripheral simulation points based on perturbation of the arbitrary mask segment, obtaining a neural Jacobian matrix model through artificial neural network (ANN) training which uses the first training data as an input and the second training data as an output, and applying a prediction value based on the neural Jacobian matrix model to mask optimization (MO) to minimize an edge placement error (EPE) in the mask layout.

According to some aspects of the inventive concepts, there is provided a method of manufacturing a mask, the method including performing a general optical proximity correction (OPC) method on a mask layout to obtain a first OPCed layout, performing an OPC method using a neural Jacobian matrix on the first OPCed layout to obtain a second OPCed layout, performing optical rule check (ORC) on the second OPCed layout, transferring a final OPCed layout, undergoing the ORC, as mask tape-out (MTO) design data, preparing mask data, based on the MTO design data, and writing a mask substrate, based on the mask data, wherein an OPC method using a neural Jacobian matrix includes obtaining a neural Jacobian matrix model through artificial neural network (ANN) training and applying a prediction value based on the neural Jacobian matrix model to mask optimization (MO).

BRIEF DESCRIPTION OF THE DRAWINGS

Embodiments will be more clearly understood from the following detailed description taken in conjunction with the accompanying drawings in which:

FIGS. 4A and 4B are conceptual diagrams for describing a concept of second training data among pieces of training data, in the neural OPC method of FIG. 1;

DETAILED DESCRIPTION

Figure 1:
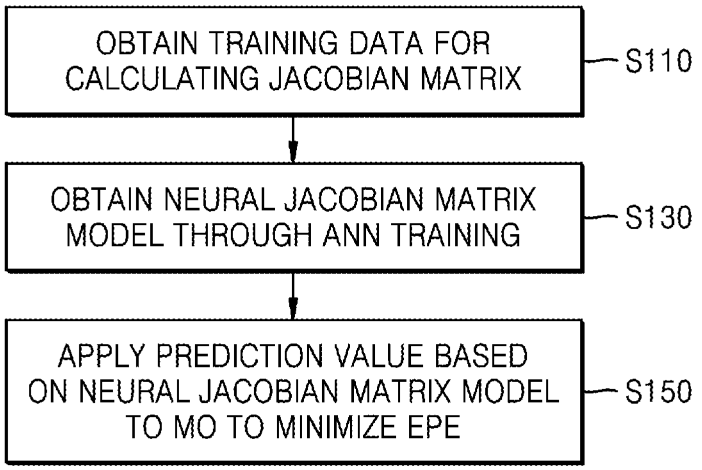
FIG. 1 is a flowchart schematically illustrating a process of an optical proximity correction (OPC) method using a Jacobian matrix, according to some embodiments.

Hereinafter, various embodiments will be described in detail with reference to the accompanying drawings. Like reference numerals refer to like elements in the drawings, and their repeated descriptions are omitted.

Figure 2:
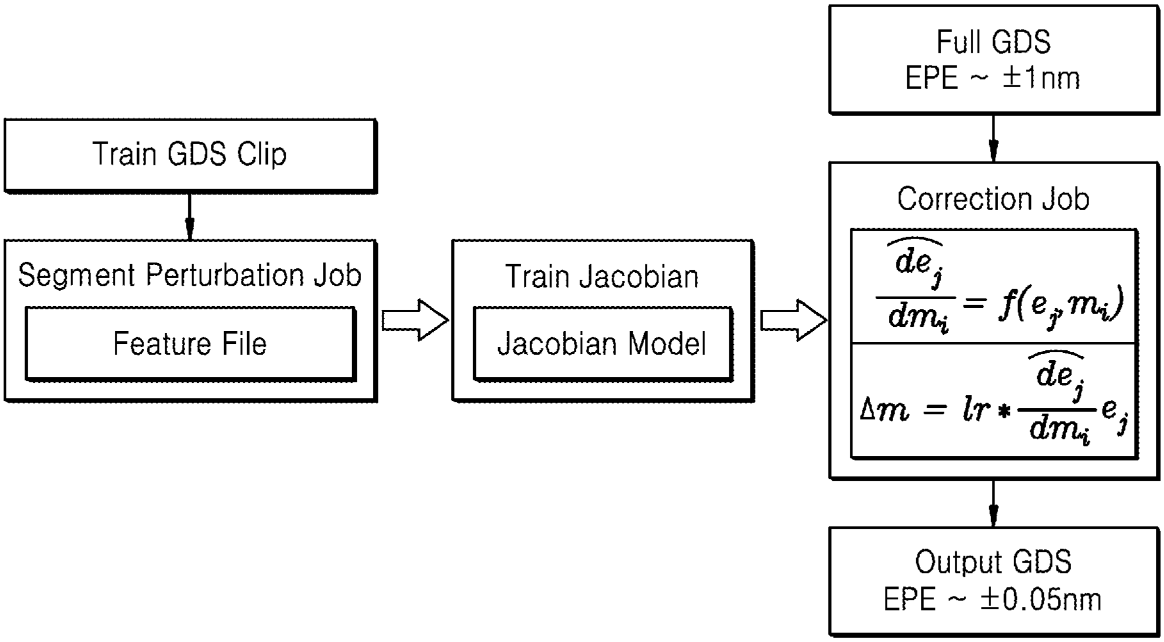
FIG. 2 is a block structure diagram illustrating a neural OPC method of FIG. 1 in terms of a concept and an effect.

FIG. 1 is a flowchart schematically illustrating a process of an optical proximity correction (OPC) method using a neural Jacobian matrix, according to some embodiments, and FIG. 2 is a block structure diagram illustrating the OPC method of FIG. 1 in terms of a concept and an effect.

Referring to FIGS. 1 and 2, first, an OPC method using a neural Jacobian matrix (hereinafter, referred to as a neural OPC method) according to some embodiments may include obtaining training data for calculating a Jacobian matrix in operation S110. Here, the Jacobian matrix may be represented as a differentiation de/dm of a mask segment m for an edge placement error (EPE) e at an arbitrary position. For example, the Jacobian matrix may denote that perturbation is applied to an arbitrary mask segment, and a response at peripheral simulation points based thereon (e.g., a variation of an EPE at peripheral simulation points) may be measured or calculated. Also, a plurality of mask segments and variations of a plurality of EPEs corresponding thereto may be calculated, and thus, the Jacobian matrix may be represented in a two-dimensional (2D) matrix form like $de_j/dm_i$. A more detailed form of the Jacobian matrix will be described in more detail with reference to FIGS. 4A and 4B.

A mask segment may denote a linear edge of a mask pattern, and an EPE may denote a value obtained by subtracting a target pattern from a mask contour at a simulation point. The target pattern may denote a pattern which is to be actually formed on a substrate, the mask contour may be a result obtained through the OPC method, and an operation of allowing the mask contour to be similar (e.g., maximally similar) to a shape of the target pattern may correspond to the purpose of the OPC method. Furthermore, a pattern on a mask may be transferred to a substrate through an exposure process, and thus, the target pattern may be formed on the substrate. However, based on a characteristic of the exposure process, a shape of the mask pattern or a shape of a layout of the mask pattern may differ from that of the target pattern.

Training data for calculating the Jacobian matrix may include first training data used as an input value and second training data used as an output value, in subsequent artificial neural network (ANN) training. In the neural OPC method according to some embodiments, the first training data may denote a relative relationship or feature between an arbitrary mask segment and peripheral simulation points. Here, the feature may include a relative position, a relative angle, and optical parameters. The first training data will be described in more detail with reference to FIG. 3. The second training data may be used as target data or output data in ANN training and may denote a real measurement value or calculation value of the Jacobian matrix.

In association with a process of obtaining training data, in FIG. 2, a 'train graphics data system (GDS) clip' may denote that GDS data of a clip, which is a portion of a full chip, may be used as training data. Also, a 'segment perturbation job' may denote a process of applying perturbation to a mask segment to obtain a response at peripheral simulation points based thereon, and a 'feature file' may denote a data file of a relative relationship between the mask segment and peripheral simulation points described above.

After the training data is obtained, a neural Jacobian matrix model may be obtained through ANN training in operation S130. The neural Jacobian matrix model may denote a model of predicting the Jacobian matrix obtained through training, instead of a real Jacobian matrix obtained through calculations or measurements. As described above, in the neural OPC method according to some embodiments, the acceleration/accuracy of a runtime of OPC may be considerably improved by using the neural Jacobian matrix model instead of the real Jacobian matrix. A process of obtaining the neural Jacobian matrix model through ANN training will be described in more detail with reference to FIGS. 5A and 5B. In FIG. 2, 'train Jacobian' may denote a process of performing ANN training so as to obtain the neural Jacobian matrix model, and a 'Jacobian model' may denote the neural Jacobian matrix model obtained through the ANN training.

After the neural Jacobian matrix model is obtained, an EPE may be minimized by applying a prediction value based on the neural Jacobian matrix model to mask optimization (MO) in operation S150. In some embodiments, the MO may be performed through gradient decent. Furthermore, in an operation of minimizing the EPE, the EPE may be calculated by applying the mask segment, that may calculated through the MO, to an optical simulation. Here, the optical simulation may be substantially the same as a process of calculating the EPE in a general OPC method. A process of minimizing an EPE through MO will be described in more detail with reference to FIGS. 6A to 7.

In FIG. 2, 'full GDS' may denote GDS data of a full chip. Furthermore, EPE~±1 nm may denote that input GDS data has an EPE of about ±1 nm. Furthermore, GDS data used as an input in an EPE minimization process may be data obtained through the general OPC method.

Here, the general OPC method may denote an OPC method fundamentally used in manufacturing a mask and may be referred to as a general OPC method, so as to be differentiated from the neural OPC method described above. The general OPC method will be briefly described below. The general OPC method may be categorized into one of two OPC method classes, which may be rule-based OPC methods and a simulation-based or model-based OPC methods. The model-based OPC method may use only measurement results of representative patterns without measuring all of a test pattern or patterns (which may be massive), and thus, the time and cost considerations of model-based OPC methods may be efficient or desirable over rule-based OPC methods, with the understanding that the present disclosure is not limited thereto.

Furthermore, the general OPC method may include a method of adding sub-lithographic features, referred to as serifs, to a corner of a pattern, in addition to modification of a layout of the pattern, or may include a method of adding sub-resolution assist features (SRAFs), such as scattering bars.

In performing the general OPC method, basic data for OPC may be first prepared. Here, the basic data may include data of shapes of patterns of a sample, positions of the patterns, the kind of measurement such as measurement of a space or a line of each of the patterns, and a basic measurement value. Also, the basic data may include information, such as a thickness, a refractive index, and a dielectric constant of a photoresist (PR), and moreover, may include a source map corresponding to an illumination system form. However, the basic data is not limited thereto.

After the basic data is prepared, an optical OPC model may be generated. A process of generating the optical OPC model may include a process of optimizing a defocus stand (DS) position and a best focus (BF) position in an exposure process. In some embodiments, the process of generating the optical OPC model may include a process of generating an optical image based on diffraction of light or an optical state of exposure equipment. However, the process of generating the optical OPC model is not limited to the above-described operations. For example, the process of generating the optical OPC model may include various details associated with an optical phenomenon in the exposure process.

After the optical OPC model is generated, an OPC model corresponding to the PR may be generated. A process of generating the OPC model corresponding to the PR may include a process of optimizing a threshold value of the PR. Here, the threshold value of the PR may denote a threshold value where a chemical change occurs in the exposure process, and for example, the threshold value may be defined as intensity of exposure. The process of generating the OPC model corresponding to the PR may also include a process of selecting an appropriate model foam from various PR model foams.

The optical OPC model and the OPC model corresponding to the PR may be generally referred to as an OPC model. After the OPC model is generated, an OPCed layout may be generated by performing a simulation using the OPC model. In association with the process of minimizing the EPE, an EPE calculation may be performed through a simulation using the optical OPC model.

In FIG. 2, 'correction job' may denote an MO process, the equation $$\frac{\widehat{de_i}}{dm_i} = f(e_j, m_i)$$

may represent a prediction value based on the neural Jacobian matrix model, and the equation $$\Delta m = lr * \frac{\widehat{de_i}}{dm_i} e_j$$

may denote an update item in gradient decent.

Also, 'output GDS' may denote GDS data output by an MO process, and moreover, EPE~±0.05 nm may denote that output GDS data has an EPE of about ±0.05 nm. As a result, it may be seen that an EPE decreases by about 5% from ±1 nm to ±0.05 nm, based on the neural OPC method according to some embodiments. Also, the prediction value based on the neural Jacobian matrix model may be used in the MO process of the neural OPC method according to some embodiments.

The neural OPC method according to some embodiments may obtain the neural Jacobian matrix model through ANN training and may use the neural Jacobian matrix model in MO, instead of the real Jacobian matrix, and thus, may accelerate a total runtime of OPC and may minimize an EPE.

For reference, in association with a method of minimizing an EPE, the OPC method may be categorized into two solvers (for example, a single variable solver and a multi variable solver). In this case, the multi variable solver may use a Jacobian matrix (dEPE/dMASK) which is an inter-segment interaction, and the Jacobian matrix may be generally calculated as an optical simulation base. For example, the Jacobian matrix may be configured to be updated in the middle of an OPC repetition simulation, or may be calculated by applying perturbation to a grouped segment. In such a method, because an optical simulation is accompanied each time, a runtime may be largely consumed.

Furthermore, there may be a method which minimizes an EPE by repeating a process of obtaining a simulation EPE, moving a mask to reduce the cost through a gradient matrix (similar to the Jacobian matrix), and obtaining the simulation EPE again. However, the method may have a problem where abnormal correction frequently occurs because the accuracy of the gradient matrix is not high (e.g., is relatively low) and a solution should be obtained within a short runtime (e.g., a relatively short runtime).

However, in the neural OPC method according to some embodiments, based on the segment perturbation job, first data which may be feature data (relative coordinates/relative angle/optical parameters) and second data which may be target data (de/dm) may be obtained as training data, and a neural Jacobian matrix model may be generated by training de/dm between proximate segments at a very accurate level (R2>0.99) by using the training data in ANN training. Also, when the neural Jacobian matrix model obtained through the ANN training is applied to an OPC engine, a Jacobian matrix between arbitrary patterns may be calculated up to a very accurate level even without an optical simulation. Also, MO may be performed through gradient decent by using the prediction value based on the neural Jacobian matrix model, and thus, an EPE may be realized up to within 0.05 nm with respect to a full chip.

Figure 3:
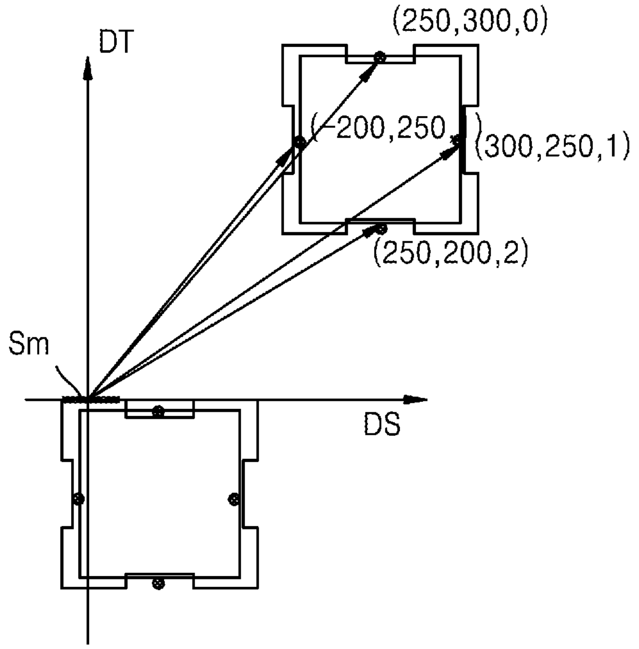
FIG. 3 is a conceptual diagram for describing a concept of first training data among pieces of training data in the neural OPC method of FIG. 1.

FIG. 3 is a conceptual diagram for describing a concept of first training data among pieces of training data in the neural OPC method of FIG. 1.

Referring to FIG. 3, as described above, the first training data may denote a relative relationship or feature between an arbitrary mask segment and peripheral simulation points. For example, in FIG. 3, in a main segment Sm is illustrated by a solid line in a mask pattern at a lower portion, a relative relationship between simulation points that is illustrated by a dotted line may be obtained as the first training data in a mask pattern at an upper portion. Here, the simulation points may denote points where an EPE is calculated. In FIG. 3, a square where the simulation points are illustrated in each of mask patterns may correspond to a target pattern. The relative relationship may include relative coordinates, a relative angle, and optical parameters. As described above, the first training data may be used as an input value in ANN training.

In FIG. 3, DS may denote a horizontal coordinate axis parallel with the main segment Sm, and DT may denote a vertical coordinate axis vertical to the main segment Sm. Two relative coordinates and one relative angle of the relative relationship in four simulation points are illustrated in a parenthesis. For example, a first digit or value in the parenthesis may represent DS coordinates, a second digit or value may represent DT coordinates, and a third digit or value may represent the relative angle. In the relative angle, 0 and 2 may be values defined as an angle parallel with the main segment Sm, and 1 may be a value defined as an angle vertical to the main segment Sm. Also, 0 may be allocated to a simulation point at an upper portion of a mask pattern which is a position similar to the main segment Sm, and 2 may be allocated to a simulation point at a lower portion facing the upper portion. As described above, when the number of simulation points are four, four pieces of first training data may be obtained on one main segment Sm. In some embodiments, hundreds of thousands to millions of pieces of first training data may be obtained. For example, the number of segments of one mask pattern may be in plurality, and moreover, the number of simulation points of a peripheral mask pattern may be four or more. Furthermore, instead of that only one peripheral mask pattern is considered on one mask pattern, all mask patterns within a certain range providing an optical effect have to be considered, and thus, the first training data may be obtained.

Furthermore, the optical parameter of the relative relationship may denote a parameter including optical information. For example, in the neural OPC method according to some embodiments, the optical parameter of the relative relationship may be an image log slope (ILS), which may be an intensity slope with respect to a distance. However, the optical parameter is not limited to the ILS. Also, other various parameters may be further included in the relative relationship as the first training data. For example, an edge length of a mask pattern may be included in the relative relationship.

Figure 4A:
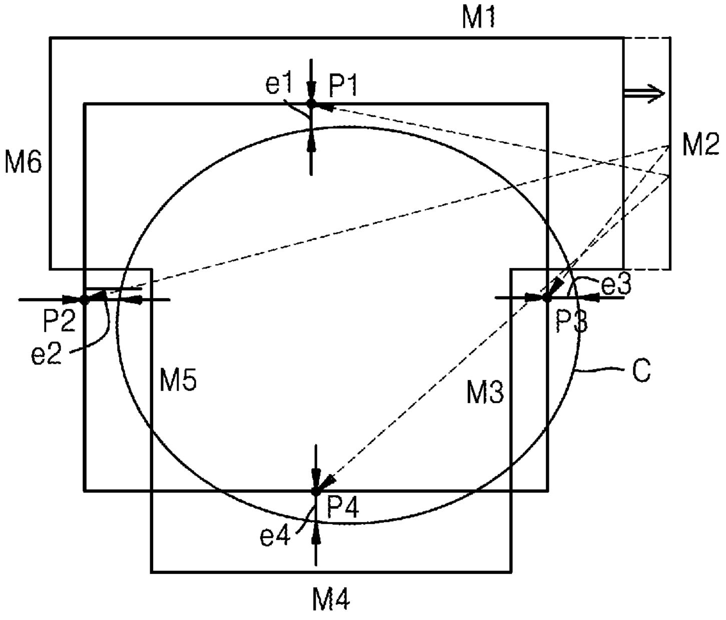

FIGS. 4A and 4B are conceptual diagrams for describing a concept of second training data among pieces of training data, in the neural OPC method of FIG. 1.

Referring to FIGS. 4A and 4B, the second training data may be used as target data or output data in ANN training. The second training data may denote a real measurement value of a Jacobian matrix. Six mask segments M1 to M6 may be extracted in one mask pattern (or a layout of a mask pattern) of FIG. 4A, and four simulation points P1 to P4 may be set. In FIG. 4A, a square box portion may correspond to a target pattern, and an oval surrounding the target pattern may correspond to a mask contour. In order to calculate the Jacobian matrix, peripheral mask patterns as well as a corresponding mask pattern may be measured, but for convenience of description, only the corresponding mask pattern may be measured.

In FIG. 4B, an actually measured Jacobian matrix value is listed in a table. For example, when perturbation is applied to a second mask pattern M2, a Jacobian matrix value (for example, $de_i/dm_2$ values) which may be a response in four simulation points P1 to P4 based thereon is illustrated in a dashed-line box portion in the table. Here, $e_j$ may represent an EPE value in a corresponding simulation point $P_j$. Such a Jacobian matrix may be represented by many combinations of mask segments of a mask pattern and simulation points of the mask pattern and peripheral mask patterns corresponding thereto. As described above, a Jacobian matrix value calculated in this manner may be used as an output value in ANN training.

Figure 5A:
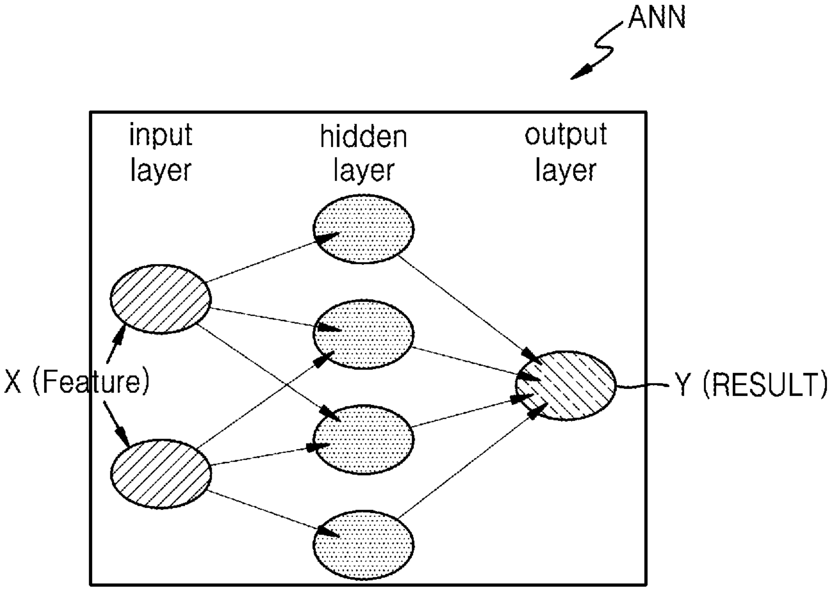
FIGS. 5A and 5B are graphs showing performance of a neural Jacobian model and an artificial neural network (ANN) used to generate the neural Jacobian model, in the neural OPC method of FIG. 1.
Figure 5B:
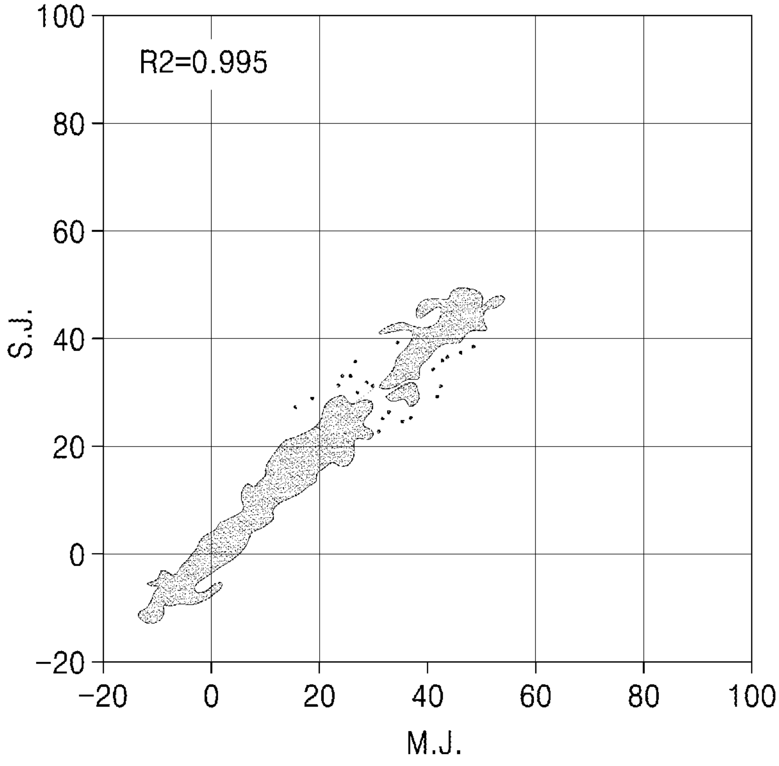

FIGS. 5A and 5B are graphs showing performance of a neural Jacobian model and an ANN used to generate the neural Jacobian model, in the neural OPC method of FIG. 1.

Referring to FIG. 5A, an ANN may be a network that may be obtained by copying or imitating a biological neural network. In FIG. 5A, for convenience of description, the ANN is illustrated as including one hidden layer. However, the ANN is not limited thereto and may include various numbers of hidden layers. Also, in FIG. 5A, it is illustrated that an input layer includes two nodes and a hidden layer includes four nodes, but the number of nodes included in the input layer and the hidden layer is not limited thereto. For example, the input layer may include three or more nodes, and the hidden layer may include tens of nodes. Furthermore, in FIG. 5A, an ANN is illustrated as including a separate input layer for receiving input data, but according to embodiments, the input data may be directly input to the hidden layer.

In the ANN, nodes of layers except an output layer may be connected to nodes of a next layer through links for transmitting an output signal. Values, obtained by multiplying node values of nodes of a previous layer by a weight allocated to each of the links, may be input to one node through the links. Node values of the previous layer may correspond to axon values, and the weight may correspond to a synaptic weight. A weight may be referred to as a parameter of the ANN. An activation function may include a sigmoid function, a hyperbolic tangent (tan h) function, and a rectified linear unit (ReLU) function, and nonlinearity may be implemented in a neural network by the activation function.

An output of an arbitrary node included in the ANN may be expressed as the following Equation 1.

$$y_i = f\left(\sum_{j=1}^{m} w_{j,i} x_j\right) \quad \text{Equation 1}$$

Equation 1 may represent an output value $y_i$ of an $i^{th}$ node corresponding to m number of input values in the arbitrary node. $x_j$ may represent an output value of a $j^{th}$ node of the previous layer, and $w_{j,i}$ may represent a weight applied to a connection portion or link between a $j^{th}$ node of the previous layer and an $i^{th}$ node of a current layer. f( ) may represent the activation function. As expressed in Equation 1, an accumulation result of the multiplication of the input value $x_j$ and the weight $w_{j,i}$ may be used in the activation function. In other words, an arithmetic operation (i.e., a multiply accumulate (MAC) operation) of multiplying the input value $x_j$ by the weight $w_{j,i}$ and summating results thereof may be performed in each node.

Furthermore, a neural model may be generated through such ANN training. In other words, when the neural model is generated through the ANN training and a certain value is input to the neural model, a prediction value or a result value corresponding thereto may be output. For example, in the neural OPC method according to some embodiments, an input value of the ANN training may be first training data, and an output value may be second training data. Also, a neural Jacobian matrix model may be obtained through the ANN training. When data corresponding to the first training data is input to the obtained neural Jacobian matrix model, a prediction value corresponding to the second training data may be calculated and output.

Referring to FIG. 5B, FIG. 5B is a graph showing performance of the neural Jacobian matrix model obtained through the ANN training in the neural OPC method according to an embodiment, where the x axis is measured Jacobian (M.J.) and represents a Jacobian matrix value obtained through actual measurement, and the y axis is simulated Jacobian (S.J.) and represents a Jacobian matrix value predicted by the neural Jacobian matrix model. Digits or values of each of the x axis and the y axis may represent values obtained by calculating an EPE as intensity and may each have an arbitrary unit.

As seen in the graph, it may be seen that a coefficient of determination R2 is 0.995 and is approximately 1. Therefore, it may be seen that matching of the neural Jacobian matrix model or a prediction value based thereon is very high.

Figure 6A:
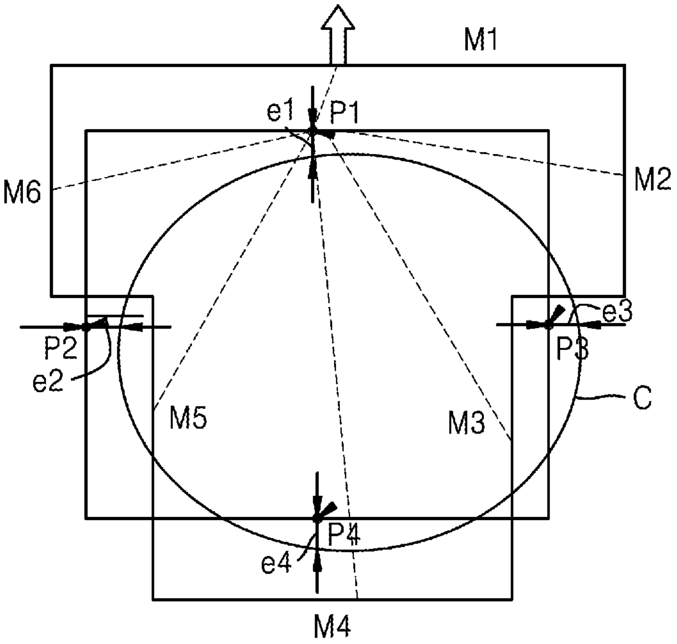
FIGS. 6A and 6B are a conceptual diagram and a graph for describing a concept of mask optimization, in the neural OPC method of FIG. 1.
Figure 6B:
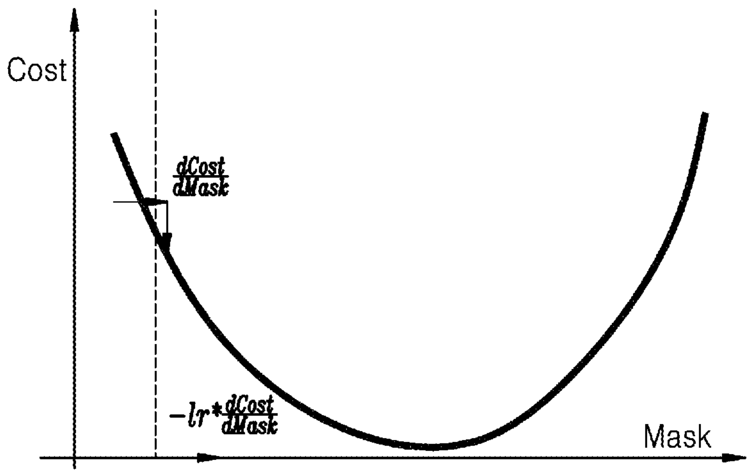

FIGS. 6A and 6B are a conceptual diagram and a graph for describing a concept of mask optimization, in the neural OPC method of FIG. 1.

Referring to FIGS. 6A and 6B, MO may use a gradient decent formula of the following Equation 2, with respect to a mask segment m and Cost.

$$m_i' = m_i - lr * d\text{Cost}/dm_i \quad \text{Equation 2}$$

Here, $m_i$ may denote a current mask segment, $m_i'$ may denote an updated mask segment, $lr*d\text{Cost}/dm_i$ may denote an update item, lr may denote a learning rate, and Cost may be defined as a sum of the square of an EPE value in simulation points corresponding to $m_i$. Stated differently, Cost may be expressed as the following Equation 3.

$$\text{Cost} = \sum_j e_j^2 \quad \text{Equation 3}$$

Here, $e_j$ may denote an EPE value in a simulation point.

The following Equation 4 may be calculated by substituting Equation 3 into Equation 2.

$$m_i' = m_i - lr'^* \sum_j (de/dm_i)_j^* e_j \quad \text{Equation 4}$$

Here, lr' may correspond to 21*r*.

The following Equations may be obtained by applying Equation 3 and Equation 4 to perturbation of a first mask segment M1 of a mask pattern of FIG. 6A.

$$\text{Cost}=e_1^2+e_2^2+e_3^2+e_4^2$$

$$m_i'=m_i-lr^*\{2e_1(de_1/dm_1)+2e_2(de_2/dm_1)+2e_3(de_3/dm_1)+2e_4(de_4/dm_1)\}$$

Also, the meaning of Equation 2 or Equation 4 may be seen in the graph of FIG. 6B. In FIG. 6B, the x axis may represent a mask pattern or a mask segment, and the y axis may represent Cost. When Cost is represented by a quadratic function as shown in the graph, Cost may be minimized by moving an update item. For example, in a portion illustrated by a dashed line, as illustrated by an arrow, the cost may be reduced by moving downward.

Furthermore, in Equation 4, $de_j/dm_i$ may correspond to a Jacobian matrix. In the neural OPC method according to some embodiments, a prediction value based on the neural Jacobian matrix model obtained through the ANN training may be used without using a Jacobian matrix value calculated through direct measurement. Therefore, an MO process may be relatively accurately performed in a relatively short time.

Figure 7:
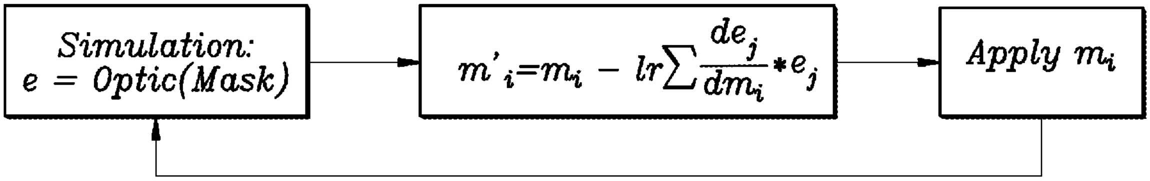
FIG. 7 is a conceptual diagram illustrating a process of applying a result of mask optimization of FIG. 6A to an optical simulation to calculate an edge placement error (EPE)

FIG. 7 is a conceptual diagram illustrating a process of applying a result of mask optimization of FIG. 6A to an optical simulation to calculate an EPE.

Referring to FIG. 7, an equation of MO is illustrated in the middle box, and in this case, lr may correspond to lr' of Equation 4. Also, in the rightmost box 'Apply $m_i$'', $m_i$ may correspond to a result calculated based on an equation of MO, and for example, may correspond to $m_i$. 'Apply' may denote that $m_i$ is substituted into Simulation of the leftmost box. In 'Simulation' of the leftmost box, Optic may denote an optical simulation, Mask may denote a mask segment, and for example, may correspond to $m_i$, and e may denote an EPE value calculated by inputting $m_i$.

As a result, the neural OPC method according to some embodiments may be a concept where $m_i$ is calculated by inputting the prediction value, based on the neural Jacobian matrix model obtained through the ANN training, to the equation of MO to decrease an EPE.

Furthermore, $m_i$ may be optimized (e.g., more optimized) by repeatedly performing an MO process. Accordingly, a smaller EPE may be calculated based on the optimized $m_i$ in an optical simulation. The equation of MO disclosed in FIG. 7 may correspond to a backward process of calculating optimal $m_i$. The equation of MO may include a forward process of calculating optimal $e_j$, and in the forward process, a prediction value based on a neural Jacobian matrix model may be calculated. Therefore, after an optimal mask pattern (e.g., the optimal $m_i$) may be obtained by performing the backward process and the forward process tens to hundreds of times, an EPE may be minimized by performing the optical simulation.

For reference, a total simulation process of calculating an EPE in FIG. 7 may be repeated for minimizing the EPE. However, after the optimal $m_i$ is calculated by sufficiently repeating the MO process, it may be advantageous in terms of a speed and accuracy in minimizing the EPE to process with the total simulation process. For example, in the neural OPC method according to some embodiments, in order to minimize the EPE, the MO process may be repeated 200 times, and the total simulation process may be repeated about 30 times. However, the number of repetitions of the MO process and the total simulation process is not limited to the numbers provided above.

Figure 8A:
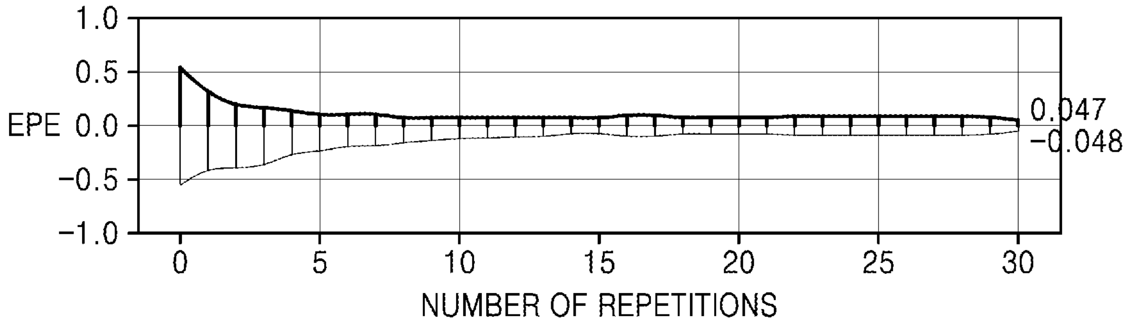
FIGS. 8A, 8B, and 8C are graphs showing an effect of the neural OPC method of FIG. 1.
Figure 8B:
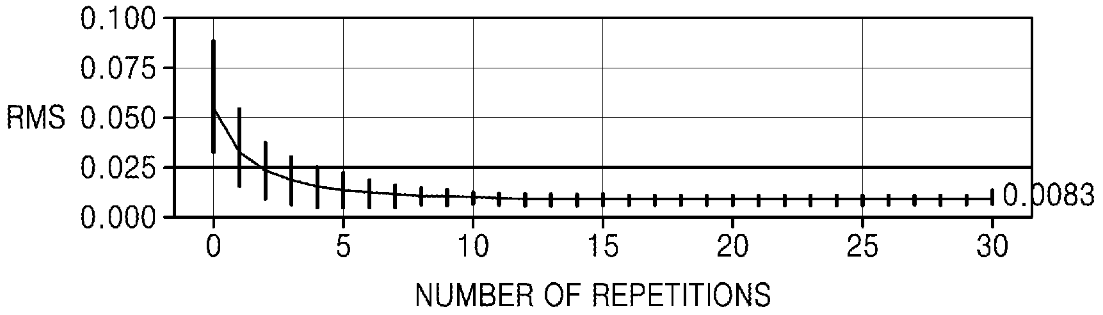
Figure 8C:
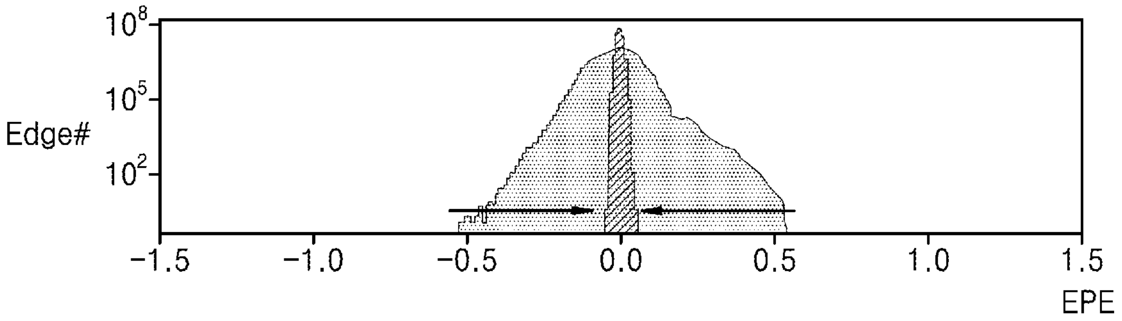

FIGS. 8A to 8C are graphs showing an effect of the neural OPC method of FIG. 1, FIG. 8A is a Min-Max Plot graph, FIG. 8B is an RMS-Plot graph, and FIG. 8C is a graph of an EPE histogram.

Referring to FIG. 8A, in the graph of FIG. 8A, the x axis represents the number of repetitions of total simulation of FIG. 7, and the y axis represents an EPE value. Also, the thick solid line represents a maximum value of an EPE value (Max), and the thin solid line represents a minimum value of an EPE value (Min). As seen in the graph of FIG. 8A, as the number of repetitions increases, an EPE value may be reduced. In detail, the EPE value may decrease up to about –0.048 to 0.047 corresponding to 30 repetitions from about –0.5 to 0.5 corresponding to 0-time repetition. Accordingly, it may be seen that a final EPE value decreases by 1/10 of an initial EPE value.

Referring to FIG. 8B, in the graph of FIG. 8B, the x axis represents the number of repetitions of total simulation of FIG. 7, and the y axis represents a root mean square (RMS) value of an EPE value. Also, mean values of the RMS value in the number of repetitions each may be connected with one another by a solid line and shown. As seen in the graph of FIG. 8B, as the number of repetitions increases, an RMS value of EPE values may be reduced. In detail, the RMS value may decrease up to about 0.0083 corresponding to 30 repetitions from about 0.05 corresponding to 0 repetitions. Accordingly, it may be seen that a final EPE value decreases by 1/8 of an initial EPE value.

Referring to FIG. 8C, in the graph of FIG. 8C, the x axis represents an EPE value, and the y axis represents the number of edges of a mask pattern. Also, thin hatching represents a distribution of EPEs based on an OPC method of a comparative example, and deep hatching represents a distribution of EPEs based on the neural OPC method according to an embodiment. As seen in the graph of FIG. 8C, in EPE distribution based on the neural OPC method according to an embodiment, it may be seen that EPEs of most edges are minimized and approximately 0.

Figure 9A:
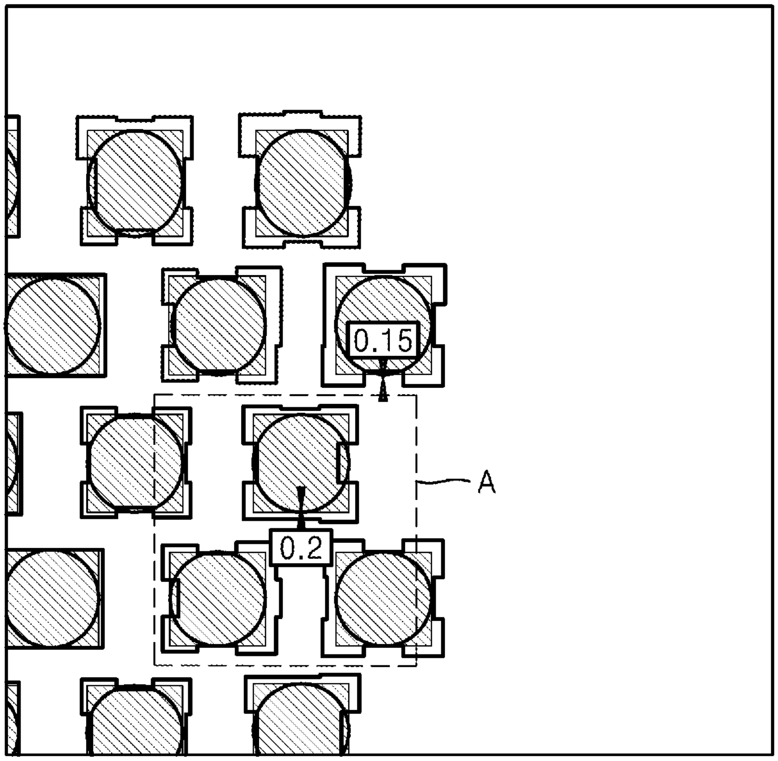
FIGS. 9A, 9B, and 9C are enlarged views and layouts of patterns showing an effect of the neural OPC method of FIG. 1.
Figure 9B:
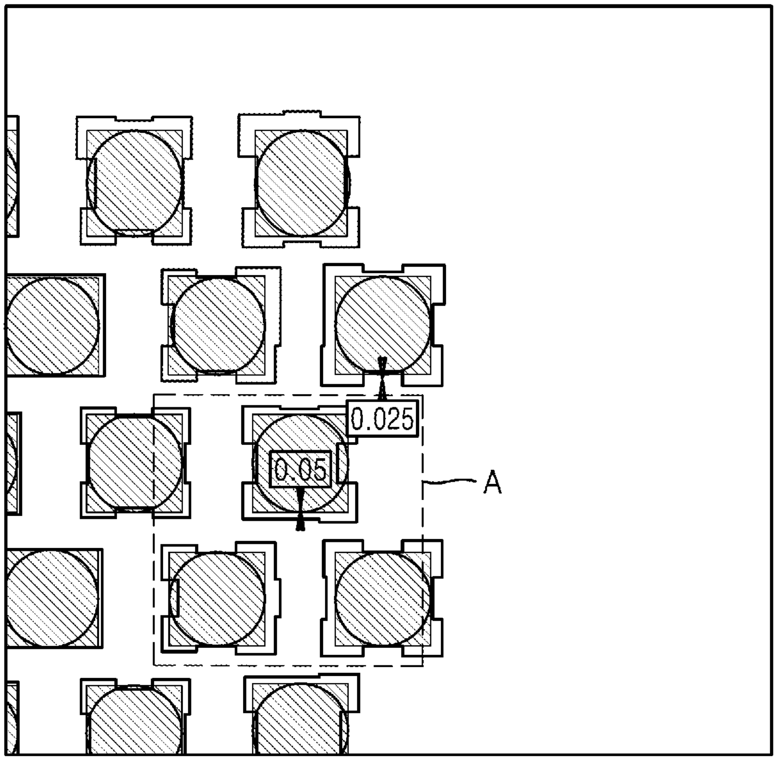
Figure 9C:
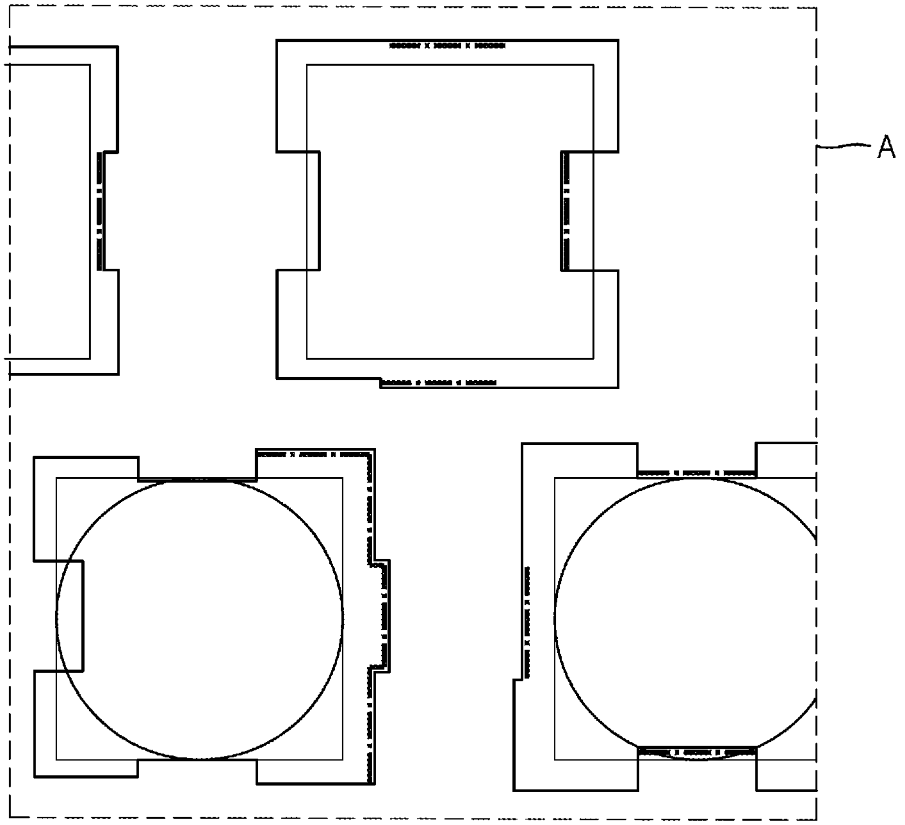

FIGS. 9A to 9C are enlarged views and layouts of patterns showing an effect of the neural OPC method of FIG. 1, FIG. 9A shows an EPE value and a mask pattern based on an OPC method of a comparative example, FIG. 9B shows an EPE value and a mask pattern based on an OPC method according to an embodiment, and FIG. 9C simultaneously shows enlarged portions A of FIGS. 9A and 9B.

Referring to FIGS. 9A to 9C, in mask patterns in a right center portion of FIG. 9A and mask patterns in FIG. 9B corresponding thereto, it may be seen that an EPE value decreases from 0.15 to 0.025 and decreases from 0.2 to about 0.05. Also, in FIG. 9C, it may be seen that some of segments of a mask pattern have slightly moved.

For reference, in FIGS. 9A and 9B, a hatched box may correspond to a target pattern, a circle illustrated by a thick solid line of FIG. 9A and a circle illustrated by a thin solid line of FIG. 9B may correspond to a mask contour, and a polygon illustrated by a thick solid line of FIG. 9A and a polygon illustrated by a thin solid line of FIG. 9B may correspond to a mask pattern, namely, a layout of the mask pattern. Also, in FIG. 9C, a polygonal thin solid line represents the mask pattern of FIG. 9B, and a thick single-dash dotted line represents a mask segment portion, which does not match the mask pattern of FIG. 9B, of the mask pattern of FIG. 9A. That is, except for a thick single-dash dotted line, the other mask segment portions of the mask pattern of FIG. 9A may match mask segments corresponding to the mask pattern of FIG. 9B.

Figure 10:
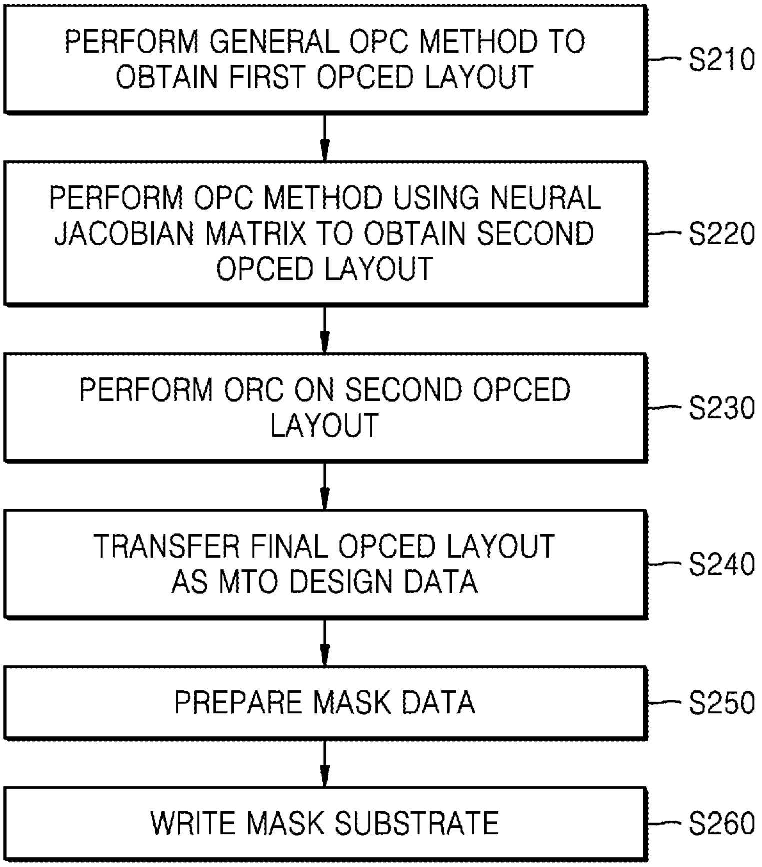
FIG. 10 is a flowchart schematically illustrating a process of a method of manufacturing a mask by using a neural OPC method, according to some embodiments.

FIG. 10 is a flowchart schematically illustrating a process of a method of manufacturing a mask by using a neural OPC method, according to some embodiments. FIG. 10 will be described with reference to FIG. 1, and descriptions which are the same as or similar to the descriptions of FIGS. 1 to 9C will be briefly given below or omitted.

Referring to FIG. 10, first, a method of manufacturing a mask (hereinafter simply referred to as a 'mask manufacturing method') by using an OPC method using a neural Jacobian matrix according to some embodiments may perform a general OPC method to obtain a first OPCed layout in operation S210. The general OPC method may be as described above with reference to FIG. 1. Generally, an OPCed layout may denote a mask layout that is or has been corrected by performing OPC on a mask layout. Therefore, a first OPCed layout may denote a mask layout corrected through general OPC.

Subsequently, in operation S220, a second OPCed layout may be obtained by performing an OPC method using a neural Jacobian matrix. The OPC method using the neural Jacobian matrix may denote the neural OPC method described above with reference to FIG. 1. Therefore, the second OPCed layout may correspond to an EPE-minimized mask layout that is obtained through the neural OPC method.

After the second OPCed layout is generated, an optical rule check (ORC) process may be performed on the second OPCed layout in operation S230. ORC may include, for example, RMS calculation on a critical dimension (CD) error, EPE calculation, pinch error check, bridge error check, and/or the like. However, items checked in ORC are not limited to those items described above.

In performing ORC, it may be determined whether there is a defect or whether there is not a defect. In some embodiments, the defect may correspond to a case where RMS on a CD error is greater than a predetermined reference value, a case where an EPE is greater than a predetermined reference value, a case where there is a pinch error, and/or a case where there is a bridge error. Also, a case where other items are in the ORC and/or a case where corresponding items are outside a criterion may correspond to the defect.

In performing the ORC, when there is a defect (e.g., when it is determined that there is a defect), based on a cause of the defect, operation S210 of generating the first OPCed layout or operation S220 of generating the second OPCed layout may be performed. Therefore, an operation of analyzing the cause of the defect and reflecting the cause of the defect in a corresponding OPC model may be preceded before performing operations S210 and S220.

In performing the ORC, when there is no defect (e.g., when it is determined that there is no defect), the second OPCed layout may be determined as a final OPCed layout, and the final OPCed layout may be transferred as MTO design data to a mask manufacturing team in operation S240. Generally, the MTO may denote that a request to manufacture a mask is issued by transferring final mask data, obtained through the OPC method, to the mask manufacturing team. Therefore, the MTO design data may be substantially the same as data of a final OPCed layout image obtained through the OPC method. The MTO design data may have a graphics data format used in electronic design automation (EDA) software and the like. For example, the MTO design data may have a data format, such as graphics data system II (GDS2) and open artwork system interchange standard (OASIS).

Subsequently, in operation S250, mask data preparation (MDP) may be performed. The MDP may include, for example, i) format conversion referred to as fracturing, ii) augmentation such as barcode for mechanical readout, a check standard mask pattern, and job deck, and iii) automatic and passive verification. Here, the job deck may denote a process of generating a text file for a series of indications such as arrangement information about multi mask files, a reference dose, and a writing speed or process.

The format conversion may denote a process of dividing (or fracturing) the MTO design data into regions to convert a format thereof into an electron beam writer format. The fracturing may include, for example, data control such as scaling, data sizing, data rotation, pattern reflection, and color conversion. In a conversion process based on fracturing, data of many systematic errors capable of occurring at an arbitrary time of a transfer process of an image on a wafer from design data may be corrected. A data correction process performed on the systematic errors may be referred to as mask process correction (MPC), and for example, may include line width adjustment, which is referred to as CD adjustment, and an operation of increasing the precision of pattern arrangement. Accordingly, fracturing may contribute to improving the quality of a final mask, and moreover, may be a process which is previously performed for MPC. Here, the systematic errors may be caused by distortion occurring in a writing process, a mask development and etching process, and a wafer imaging process.

The MDP may include the MPC. The MPC, as described above, may denote a process of correcting an error (e.g., a systematic error) occurring in a writing process. Here, the exposure process may be a concept which overall includes electron beam writing, development, etching, and baking. Furthermore, data processing may be performed before the writing process. The data processing may be a preprocessing operation on mask pattern and may include gramma check on the mask data and writing time prediction.

After the mask data is prepared, a mask substrate may be exposed based on the mask data in operation S260. Here, the exposure may denote, for example, electron beam writing. Here, the electron beam writing may be performed as a gray writing process using a multi-beam mask writer (MBMW). Also, the electron beam writing may be performed by using a variable shape beam (VSB) writer.

Furthermore, after an MDP operation is performed, a process of converting the mask data into pixel data may be performed before the writing process. The pixel data may be data directly used in real writing and may include data of a shape to be written and data of a dose applied thereto. Here, the data of the shape may be bit-map data obtained by converting shape data, which is vector data, through rasterization.

After the writing process is performed, a mask may be finished by performing a series of processes. The processes may include, for example, a development process, an etching process, and/or a cleaning process. Also, the processes for manufacturing a mask may include a measurement process and a defect check process or a defect repair process. Also, a pellicle coating process may be included in the processes. Here, the pellicle coating process may denote a process of attaching a pellicle so as to protect a mask surface from subsequent pollution during the transfer of the mask and an available lifetime of the mask, when it is determined through final cleaning and check that there are no pollutants or chemical stains.

The method of manufacturing a mask according to some embodiments may use an OPC method using a neural Jacobian matrix. Therefore, the method according to an embodiment may obtain the neural Jacobian matrix model through ANN training and may use the neural Jacobian matrix model in MO, instead of the real Jacobian matrix, and thus, may accelerate a total runtime of OPC and may minimize an EPE. In greater detail, by performing segment perturbation, first data which may be feature data (relative coordinates/relative angle/optical parameters) and second data which may be target data (de/dm) may be obtained as training data (e.g., massively obtained as training data), and a neural Jacobian matrix model may be generated by using the training data in ANN training. Also, MO may be performed through gradient descent by using a prediction value based on the neural Jacobian matrix model, and thus, an EPE may be realized up to within 0.05 nm with respect to a full chip.

Some examples of embodiments have been described by using the terms described herein, but this has been merely used for describing the inventive concepts and has not been used for limiting a meaning or limiting the scope of the inventive concepts defined in the following claims. Therefore, it may be understood by those of ordinary skill in the art that various modifications and other equivalent embodiments may be implemented from the inventive concept. Accordingly, the scope of the inventive concepts may be defined in part based on the scope of the following claims.

While the inventive concepts have been particularly shown and described with reference to some examples of embodiments thereof, it will be understood that various changes in form and details may be made therein without departing from the scope of the following claims.

What is claimed is:

1. An optical proximity correction (OPC) method for a mask used in manufacturing a pattern in a semiconductor process, the OPC method comprising:

obtaining training data for calculating a Jacobian matrix which is a differentiation of a mask segment for an edge placement error (EPE);

obtaining a neural Jacobian matrix model through artificial neural network (ANN) training using the training data; and applying a prediction value based on the neural Jacobian matrix model to mask optimization (MO) to minimize the EPE, resulting in a mask layout used to generate the mask, wherein input data of the training data used in the ANN training corresponds to a relative feature between an arbitrary mask segment and peripheral simulation points and comprises a relative position, a relative angle, and optical parameters.

2. The OPC method of claim 1, wherein the input data is first training data, and wherein the training data further comprises second training data that corresponds to a response to the peripheral simulation points based on perturbation of the arbitrary mask segment.

3. The OPC method of claim 2, wherein the second training data is used as output data in the ANN training.

4. The OPC method of claim 1, wherein the minimizing of the EPE comprises performing the MO by using gradient decent.

5. The OPC method of claim 4, wherein the gradient decent is expressed as:

$$m_i' = m_i - lr^*(\mathrm{dCost}/dm_i)$$

where $m_i$ denotes a current mask segment, and $m_i'$ denotes an updated mask segment, Cost denotes $$\sum_j e_j^2,$$

$e_j$ denotes an EPE value of a simulation point corresponding to $m_i$, and lr denotes a learning rate.

6. The OPC method of claim 4, wherein the gradient decent is expressed as:

$$m_i' = m_i - lr^* \sum_j (de/dm_i)^* e_j$$

where $m_i$ denotes a current mask segment, and $m_i'$ denotes an updated mask segment, $e_j$ denotes an EPE value of a simulation point corresponding to $m_i$, lr denotes a learning rate, and the prediction value is used in $de_j/dm_i$.

7. The OPC method of claim 4, wherein the minimizing of the EPE comprises inputting the arbitrary mask segment, obtained by performing the gradient decent at least once, to an optical simulation to calculate the EPE.

8. The OPC method of claim 1, further comprising obtaining, as the training data, graphics data system (GDS) data of a clip which is a portion of a full chip, wherein the minimizing of the EPE comprises inputting the GDS data of the full chip to calculate the EPE.

9. An optical proximity correction (OPC) method for a mask layout used in manufacturing a semiconductor pattern, the OPC method comprising:

obtaining first training data and second training data, the first training data corresponding to a relative feature between an arbitrary mask segment and peripheral simulation points, and the second training data corresponding to a response to the peripheral simulation points based on perturbation of the arbitrary mask segment;

obtaining a neural Jacobian matrix model through artificial neural network (ANN) training which uses the first training data as an input and the second training data as an output; and applying a prediction value based on the neural Jacobian matrix model to mask optimization (MO) to minimize an edge placement error (EPE) in the mask layout.

10. The OPC method of claim 9, wherein the first training data comprises a relative position, a relative angle, and optical parameters.

11. The OPC method of claim 9, wherein the minimizing of the EPE comprises performing the MO by using gradient decent.

12. The OPC method of claim 11, wherein the gradient decent comprises differentiation of cost which is a sum of a square of an EPE value in the simulation points corresponding to the arbitrary mask segment, and wherein the prediction value is used in the differentiation.

13. The OPC method of claim 11, wherein the minimizing of the EPE comprises inputting the arbitrary mask segment, obtained by performing the gradient decent at least once, to an optical simulation to calculate the EPE.

14. A method of manufacturing a mask, the method comprising:

performing a general optical proximity correction (OPC) method on a mask layout to obtain a first OPCed layout;

performing an OPC method using a neural Jacobian matrix on the first OPCed layout to obtain a second OPCed layout;

performing optical rule check (ORC) on the second OPCed layout;

transferring a final OPCed layout, that has passed the ORC, as mask tape-out (MTO) design data;

preparing mask data, based on the MTO design data; and writing a mask substrate, based on the mask data, wherein an OPC method using a neural Jacobian matrix comprises obtaining a neural Jacobian matrix model through artificial neural network (ANN) training and applying a prediction value based on the neural Jacobian matrix model to mask optimization (MO).

15. The method of claim 14, wherein the OPC method using the neural Jacobian matrix comprises:

obtaining first training data that corresponds to a relative feature between an arbitrary mask segment and peripheral simulation points and second training data that corresponds to a response to the peripheral simulation points based on perturbation of the arbitrary mask segment;

obtaining a neural Jacobian matrix model through the ANN training which uses the first training data as an input and the second training data as an output; and applying the prediction value to the MO to minimize an edge placement error (EPE).

16. The method of claim 15, wherein the first training data comprises a relative position, a relative angle, and optical parameters.

17. The method of claim 15, wherein the minimizing of the EPE comprises performing the MO by using gradient decent.

18. The method of claim 17, wherein the gradient decent comprises differentiation of cost which is a sum of a square of an EPE value in the simulation points corresponding to the arbitrary mask segment, and wherein the prediction value is used in the differentiation.

19. The method of claim 17, wherein the minimizing of the EPE comprises inputting the arbitrary mask segment, obtained by performing the gradient decent at least once, to an optical simulation to calculate the EPE.

* * * * *